United States Patent [19]

Naden et al.

[11] 4,159,412

[45] Jun. 26, 1979

[54] MAGNETIC BUBBLE MEMORY CHIP SYNCHRONIZATION AND REDUNDANCY

[75] Inventors: Rex A. Naden, Richardson; David M. Lee, Plano; Richard T. Tarrant, Richardson, all of Tex.

[73] Assignee: Texas Instruments Incorporated, Dallas, Tex.

[21] Appl. No.: 767,852

[22] Filed: Feb. 11, 1977

[51] Int. Cl.$^2$ ............................................. G11C 19/08
[52] U.S. Cl. ......................................... 365/15; 365/12
[58] Field of Search .............................. 340/174 TF; 364/200 MS File, 900 MS File; 365/1, 15, 12

[56] References Cited

U.S. PATENT DOCUMENTS

| | | | |
|---|---|---|---|
| 3,792,450 | 2/1974 | Bogar et al. | 340/174 TF |
| 3,838,406 | 9/1974 | Cohen et al. | 340/174 TF |
| 3,909,810 | 9/1975 | Naden et al. | 340/174 TF |

OTHER PUBLICATIONS

AIP Conference Proceedings–No. 29; Dec. 9–12, 1973, pp. 51–53.

*Primary Examiner*—James W. Moffitt
*Attorney, Agent, or Firm*—Melvin Sharp; Richard L. Donaldson; William E. Hiller

[57] ABSTRACT

A magnetic memory system is provided that includes magnetic domain data chips having a block replicate organization wherein the system may include data chips having one or more defective minor loops. A dedicated minor loop is provided on the chip to store a redundancy map for locating the defective minor loops. The dedicated minor loop also provides for storing a synchronization pattern for initializing the system by having each minor loop properly addressed for transferring magnetic domains. The dedicated loop can only be accessed by a separate swap pin preventing a write operation by the user thus preserving the data stored therein.

18 Claims, 5 Drawing Figures

MAGNETIC BUBBLE MEMORY CHIP SYNCHRONIZATION AND REDUNDANCY

BACKGROUND OF THE INVENTION

1. Field of the Invention

The present invention pertains to magnetic domain memory devices and more particularly to a data chip having a dedicated minor loop for storing synchronization and redundancy data.

2. Description of the Prior Art

In recent years tremendous progress has been made in developing equipment for electronic data processing such that today high speed reliable hardware is available to the data processing designer. The newly developed electronic components, particularly those using integrated circuits, have greatly increased the capacity of modern electronic data processing equipment to process data. As the speed and capacity of processing have increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extremely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics*, Vol. MAG - 5, No. 3 (1969), pp. 544–553, "Application of Orthoferrites to Domain - Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction out of the plane and that small localized single domain regions of magnetic polarization aligned opposite to the general polarization direction may be supported. Such localized regions which are generally cylindrical in configuration represent binary memory bits. Interest in these devices in large part is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such material as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto and by a separate write connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically, all of the minor loops in the chip, upon command, transfer in parallel the bubbles from their corresponding positions to the major loop. The bubbles are then serially detected as they are propagated past a read position. New data may also be inserted at a write position for parallel transfer back into the minor loops at an appropriate time later (when major loop magnetic domain propagation aligns the data for transfer).

Simultaneous reading/writing of data into a grouping of related major loops gives the capacity of treating related magnetic domains as digital or other coded words. Time multiplexed groups of data chips permits reading and writing of data in a time sharing fashion to permit an overall memory data rate greater than that permitted by magnetic domain propagation in a single chip.

Another structural organization of operable magnetic domains is the block replicate organization, also well known in the art. This organization is presented in an article appearing in *AIP Conference Proceedings on Magnetism and Magnetic Materials*, No. 29 (1975), pp. 51–53, entitled "64K Fast Access Chip Design". The block replicate organization includes open ended major propagation paths which may be established by an arrangement of T-bar permalloy circuits on, for example, a rare earth orthoferrite platelet. These major propagation paths are aligned adjacent to a plurality of minor loops. Data is written into the minor loops from a major propagation path by way of a swap transfer gate. Old data is transferred into the major propagation paths by a swap signal received from a controller chip and is ultimately annihilated. A subsequent swap signal transfers new data into the minor loops where it becomes non-volatile. To read data out of the minor loops in a block replicate organization it is necessary to read out the magnetic domains onto separate major propagation paths. A replicate gate between the minor loops and the major propagation paths allows the stored data to remain with the minor loops with the data that is read out onto the major propagation path being a replicated version of the stored data. The major distinction between a block replicate organization and a major-minor loop organization is that the data stored within the minor loops remains in the minor loops during the read operation mode in a block replicate while the stored data is transferred completely out onto a major propagation path before replication to a user system in a major-minor loop organization. Also since it is not physically possible to locate the minor loops so as to take advantage of all locations on the major propagation paths, the rate of bubble movement within the respective minor loops is greater than that possible at the detector. In order to overcome this physical disability, the major propagation paths in the block-replicate organization at the output for the reading of the minor loops are merged. Making one major propagation path shorter by one position as compared to another major propagation path allows a merger of the two paths with one path complementing the voids present in the other path. The result of the merger is to double the data rate out of the minor loops to the detector making it equal to the rate within the minor loops.

In both the block replicate organization and the major-minor loop organization, unless special provision is made, every loop in every chip of the system must be perfect for the system to perform satisfactorily. Since chips contain entire groupings of registers, a defect in one of the minor loops would require discarding the entire chip. Various techniques have been proposed in the art for permitting the use of a magnetic domain chip even though one or more of its minor loops may be defective. Exemplary techniques are described, for example, in U.S. Pat. No. 3,909,810 entitled "Bubble Memory Minor Loop Redundancy Scheme", which is assigned to the assignee of the present invention and "Fault-Tolerant Memory Organization: "Impact on Chip Yield and System Cost", *IEEE Transactions Magnetics*, September, 1974. These techniques utilize separate magnetic domain chips to store locations of defective loops. A further example of a technique to overcome this deficiency is found in pending U.S. Patent Application Ser. No. 594,901 filed July 10, 1975 entitled "Magnetic Domain Minor Loop Redundancy Scheme", now U.S. Pat. No. 4,070,651 issued Jan. 24, 1978 also assigned to the assignee of the present invention. The technique described therein is an important step in development of a system using data chips with defective minor loops. Generally, what is disclosed therein is the use of a non-volatile semiconductor memory, such as a programmable read-only-memory, to store data identifying the relative positions of defective minor loops to each other. This data is used to control logic so that a stream of data bubbles to be transferred into the minor loops for storage, for example, contains intermittent voids corresponding to defective minor loop locations. This latter technique is especially beneficial for storing redundancy data designating defective minor loops in a series of magnetic bubble data chips in a magnetic bubble domain system. A further improvement on this technique is found in pending U.S. Pat. Application Ser. No. 752,947 filed Dec. 17, 1976, entitled "Bubble Redundancy Map Storage Using Non-Volatile Semiconductor Memory" which is also assigned to the assignee of the present invention. This improvement provides for the redundancy data to be stored in an erasable non-volatile semiconductor memory to facilitate magnetic bubble data chip replacement without having to replace the entire array of redundancy data for all data chips within a magnetic domain system.

A further problem found in accessing stored data from a magnetic domain system is the requirement to know at any time the location of specific data stored within the minor loops. In order to be able to locate this data, it is necessary to know when the input or output absolute address in the minor loop and page address in the minor loop containing the data coincide. The minor loop is partitioned into a number of positions capable of supporting and storing magnetic domains, these positions being the absolute addresses of the minor loop. However, the nature of the magnetic domain device is to move individual magnetic domains through each of the positions of the minor loop, and thus each magnetic domain has a page address it retains as it propagates through each absolute address. The absolute address nearest the swap transfer gate may be designated as the input absolute address, while the absolute address nearest to the replicate gate may be designated as the output absolute address. When a user asks for a specific piece of data, although the page address for the data is known, in order to read it out the user must also know at which absolute address it is located so that a control signal can move that page to the appropriate absolute address.

SUMMARY OF THE INVENTION

A preferred magnetic domain memory structure in accordance with the present invention includes a block replicate data chip having a plurality of minor loops and at least one major propagation path adjacent to the minor loops at both ends thereof. A swap transfer gate is disposed between the minor loops and a first major propagation path, which is connected to a bubble generator and bubble annihilator, for exchanging new magnetic bubbles for the old bubbles stored in the minor loops. A replicate gate is disposed between the plurality of minor loops and a second major propagation path for reading magnetic bubbles out of the plurality of minor loops and onto the major propagation path which is operatively connected to a magnetic domain detector for sensing and absence or presence of a magnetic bubble. One minor loop out of the plurality of minor loops is separated therefrom and dedicated to storing a synchronization pattern and a redundancy loop map. The redundancy loop map will designate all of the defective minor loops on the data chip. The synchronization pattern is a predetermined pattern of magnetic domains which when recognized by a control system will provide a synchronization point which acknowledges data in each minor loop to be at a fixed address. This dedicated minor loop may be accessed only by special instrumentation through a separate swap gate which protects it from being destroyed by a user of the data chip. In order to facilitate reading the dedicated loop, separate read means in the form of replicate pins may be used. This data which is stored in the dedicated loop is read into shift registers on a control chip and used to control logic which prevents accessing defective minor loops and enables the user to read and write magnetic domains at any specific location on each minor loop.

In a preferred embodiment of the invention two groupings of minor loops are present, each attached at both ends to major propagation paths. A swap transfer gate is disposed between the minor loop groupings and their respective major propagation paths while the replicate gate is also disposed between each minor loop grouping and its respective major propagation path. The dedicated minor loop for storing synchronization patterns and redundancy loop maps is disposed adjacent to one group of minor loops, storing data pertaining to all the minor loops on the data chip. The block replicate data chip used in accordance with the present invention having a dedicated minor loop for storing synchronization and redundancy data enhances the performance of the magnetic domain structure in synchronizing the addresses of the minor loops on the data chip and by designating which of the minor loops are defective and incapable of propagating magnetic domains. Storing the redundancy loop map on the data chip in a dedicated minor loop prevents the need for separate non-volatile memories for storing redundancy data.

DETAILED DESCRIPTION

Figure 1:
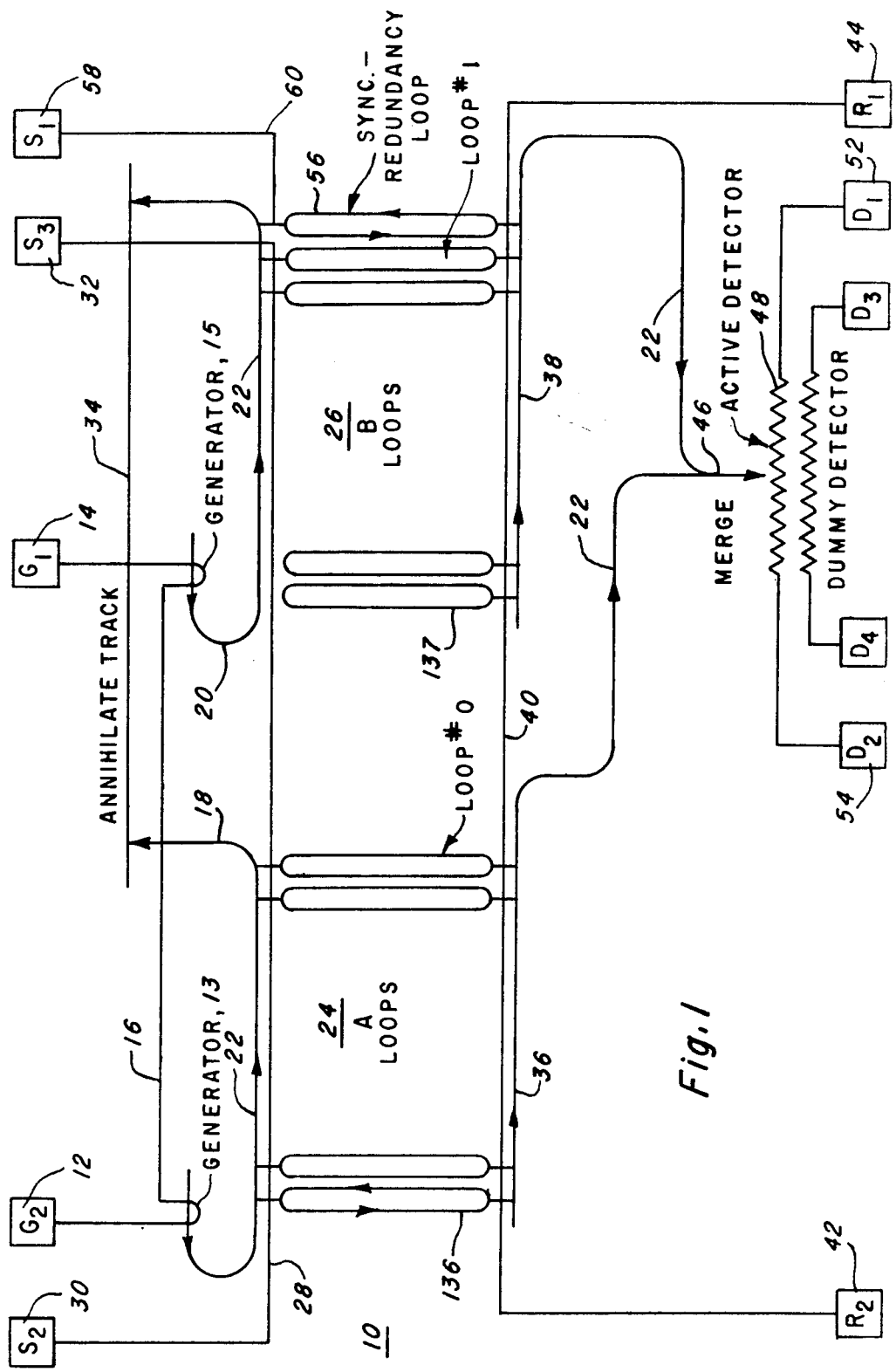
FIG. 1 is a schematic diagram illustrating a block replicate data chip of a magnetic domain memory structure in accordance with the present invention.

Referring now to the drawings and more particularly to FIG. 1, a block replicate magnetic domain memory structure 10 is illustrated. In a preferred embodiment shown in FIG. 1 two generators 13 and 15 connected in series through pins 12 and 14 generate magnetic domains. The generators 13 and 15 are connected to major propagation paths 18 and 20 which contain a number of positions capable of supporting magnetic domains. Once in the major propagation paths 18 and 20, magnetic domains are circularly propagated in transfer direction 22 by an in-plane rotating magnetic field.

Aligned adjacent to major propagation paths 18 and 20 are a series of identical minor loops divided into two sections 24 and 26, with each section having a plurality of minor loops. By way of illustration only, both sections 24 and 26 each comprise 69 minor loops. The number and size of the minor loops are dependent upon the chip capacity needed for any one application. Minor loop arrays 24 and 26 are disposed adjacent to major propagation paths 18 and 20 in a perpendicular fashion and being connected together by transfer line 28 which contains in a serially connected fashion swap transfer gates for each minor loop.

A transfer pulse is applied to transfer line 28 by way of pins 30 and 32 which cause the magnetic domains or the absence of magnetic domains which are located on major propagation paths 18 and 20 to be exchanged with old data stored in minor loop arrays 24 and 26. At one in-plane magnetic field cycle the old data in minor loop arrays 24 and 26 is transferred to their respective major propagation paths 18 and 20 and subsequently delivered to annihilation track 34 which may be in the form of a permanent magnet having a polarity different from that of the magnetic domains and thus absorbing them. At a subsequent field cycle or during the latter portion of the same cycle the new data is swapped into the minor loops of minor loop arrays 24 and 26 from their respective major propagation paths 18 and 20.

Disposed adjacent to minor loop arrays 24 and 26 and opposite to major propagation paths 18 and 20 are major propagation paths 36 and 38. Major propagation paths 36 and 38 are connected to minor loop arrays 24 and 26 by way of replicate line 40 which includes a series of replicate gates. A transfer pulse at pins 42 and 44 will cause the magnetic bubbles closest to replicate line 40 in the minor loop arrays 24 and 26 to be stretched and separated into two bubbles, one of which is transferred to their respective major propagation paths 36 and 38. Major propagation paths 36 and 38 merge into major propagation path 46 which delivers magnetic domains serially to active detector 48.

Active detector 48 acknowledges the presence or absence of a magnetic domain while the dummy detector 50 cancels out noise caused by the rotating field flux. The rotating field has an equal effect on the primary detector 48 and the dummy detector 50, therefore canceling these signals caused by the rotating field and will leave a unique signal that is caused by a magnetic domain appearing on the primary detector which can be detected and delivered by pins 52 and 54.

One minor loop 56 adjacent to the minor loop array 26 is dedicated for the purpose of storing synchronization and redundancy loop map data. This dedicated loop 56 is only capable of receiving written data by instrumentation connected to pin 58 pulsing the swap transfer line 60. Restricting this special instrumentation prevents writing new data into minor loop 56 and swapping out old data which would be absorbed at annihilation track 34. Thus the synchronization pattern and redundancy loop map cannot be disturbed by an unknowing user.

The synchronization pattern is a series of magnetic domains or the absence of magnetic domains (voids) forming a pattern which when recognized by a control chip (hereinafter described) acknowledges a synchronization condition whereby data stored within minor loop arrays 24 and 26 are at a known address on their respective minor loops. The synchronization pattern may also contain additional information such as minor loop size (bit capacity), chip write protect requirements, and chip serial number. The redundancy loop map stored in minor loop 56 is also a series of magnetic domains and voids representing operative and inoperative or defective minor loops which are incapable of propagating magnetic domains.

Figure 2:
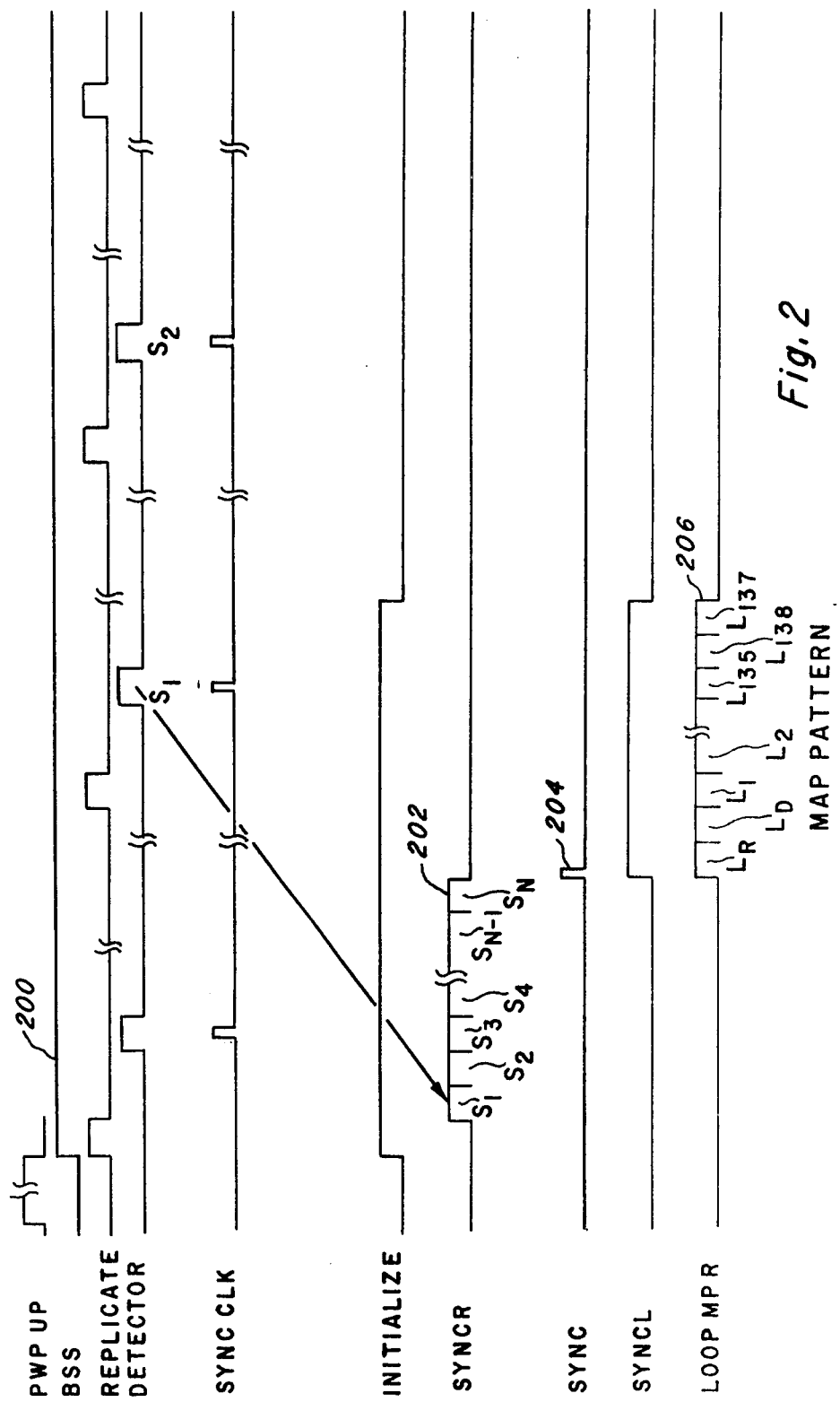
FIG. 2 is a timing diagram illustrating operation of the structure shown in FIG. 1.
Figure 3:
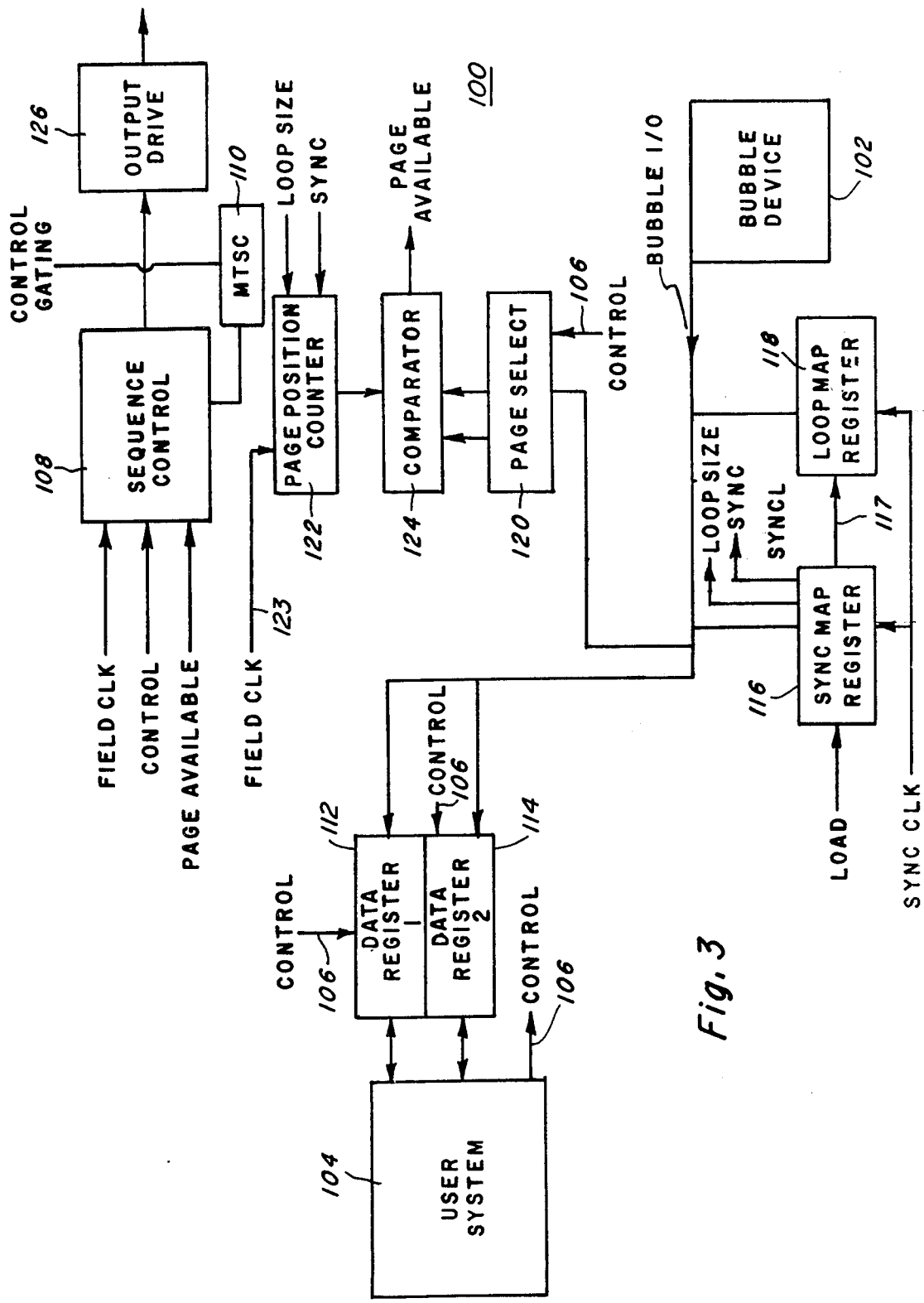
FIG. 3 is a block diagram showing a control system to implement the magnetic domain memory structure shown in FIG. 1.

In order to operationally describe the magnetic domain structure, reference is now made to FIGS. 2 and 3. The magnetic domain memory system 100 in FIG. 3 contains a magnetic domain (bubble) device 102 as the magnetic domain structure 10 depicted in FIG. 1, for example. The user system 104 utilizing the magnetic bubble device 102 may be a microprocessor unit such as that marketed by Texas Instruments Incorporated, Dallas, Texas as Model 9900. The user 104 at power-up knows only the page of information and not the absolute address of that page within the minor loop. The sequence control 108 controls the access to various registers and delivers information to the bubble device 102 as to what function should be performed. At power-up the sequence control 108 acknowledges that it is dealing with a "cold" chip and starts an initialization of FIG. 2.

The first step of initializing the bubble device as shown in timing diagram FIG. 2 is the BSS, Bubble Shift Start 200 which is the start of propagating the bubbles in the minor loops and immediately replicating out onto the appropriate major propagation paths. Upon replication the major track shift counter (MTSC) 110 in FIG. 3 counts down the remaining positions through which the bubble must travel before arriving at the detector. When this last position is reached a signal is sent by the MTSC 110 to sequence control 108 which in turn signals the output drive 126 to activate the detector.

The SYNC map register 116 has stored a synchronization pattern. As the data is read out of the minor loops the data of loop 56 only is shifted through data register 116 until a pattern match is found. As shown in the timing diagram of FIG. 2 after the last bit of the synchronization pattern 202 is read and shifted through sync register 116, a sync pulse 204 is delivered to the page position counter 122 in FIG. 3. At this point in time the page position counter 122 knows that page 0 and absolute address 0 are at the same position on the minor loop. This information plus the size of the minor loops or chip capacity enables the counter 122 to stay in step with the propagating magnetic domains until the required page of data is at the replicate out location. The field clock (field clk) 123 causes the counter 122 to count each field rotation and page movement.

The loop map register 118 receives a latch signal 117 from the sync map register 116 in FIG. 3 and begins accepting data bits up to the number of minor loops in the system, as the 138 minor loops shown in FIG. 1. The data stored in register 118 is used to mask out the defective minor loops in the bubble device 102 during subsequent reading and writing operations. For example, a bit "one" can represent a good loop and a bit "zero" can represent a bad loop.

Upon completion of the initialization routine as shown in FIG. 2 of reading the bubble device 102 by replicating and detecting magnetic bubbles until the synchronization pattern 202 and redundancy loop map 26 are stored in registers 116 and 118 of FIG. 3, normal user operation begins. The page of the data desired by the user system 104 is delivered by control 106 to a page selector register 120. The page position counter 122 is at the zero position at sync pulse 204 and counts the bubble positions until the comparator register 124 signals that the page position of the counter 122 is equivalent to the desired data page stored in the page select register 120. Having an input of chip capacity, i.e., loop size, enables the page position counter 122 to automatically return to the zero position after the last position has been reached. The comparator 124 then signals the sequence control 108 that the desired page is available for reading or writing. If the absolute address 0 and the page 0 were at the replicate position and the user wanted to write a new page 0, the counter 122 would count incrementally to the number it takes to reach the swap gate, this information being calculated from knowing the loop size. The sequence control 108 then signals output drive 126 which designates which mode of operation the chip will employ, that is activate the swap gate or the replicate gate. After replication, the MTSC 110 will again count the positions remaining to the detector and activate the detector by signaling the sequence control 108 which in turn signals the output drive 126.

Data from the bubble device 102 is then delivered to data buffers 112 and 114 which are accessed by the user system 104. When writing to the bubble device 102, the user system 104 will repeat the page instruction as described and store the data to be written into the minor loops in buffers 112 and 114.

Figure 4:
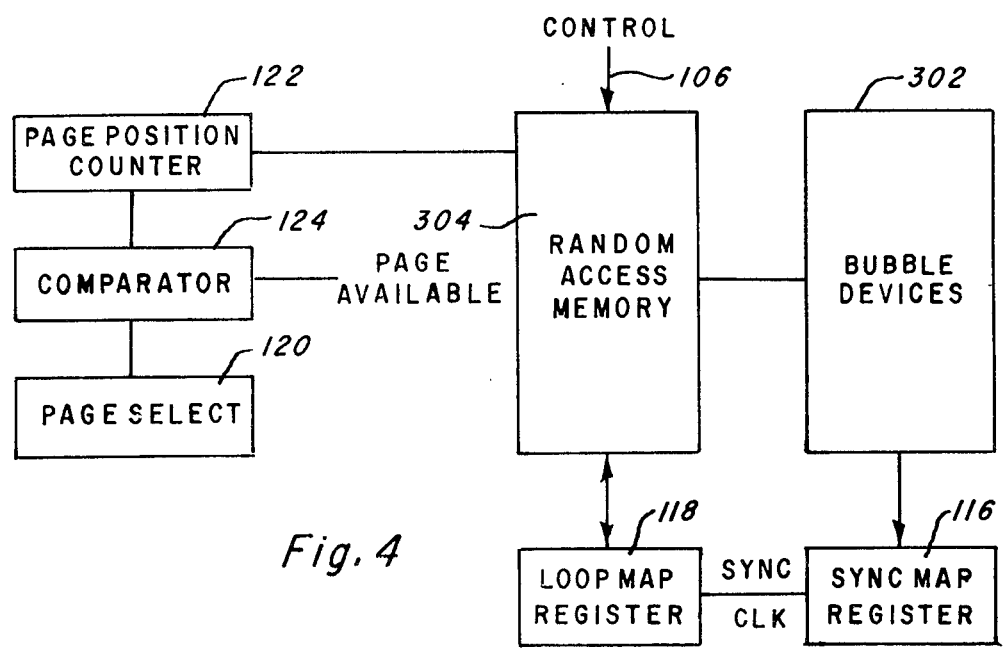
FIG. 4 is a block diagram showing use of a random access memory added to the control system of FIG. 3 to control a plurality of bubble devices.

In the magnetic domain memory system in FIG. 3, only one bubble device 102 is utilized by the user system 104. In order to increase the capacity of such a system, the number of bubble devices must be increased. FIG. 4 shows the use of a plurality of bubble devices 302 and how the synchronization pattern and redundancy data taken from a dedicated minor loop, as minor loop 56 in FIG. 1, can be stored.

The addition of a volatile random access memory 304 in FIG. 4 to the system 100 in FIG. 3 enables the user to store the redundancy maps from all the bubble devices 302. Operationally, the initialization routine would be the same as described for the single chip system only done on a chip by chip basis. The redundancy maps are sequentially stored in the random access memory 304 along with the last page position accessed for each chip. The user system would then be able to access information from bubble devices 302 by providing a chip number and page number accessing an appropriate redundancy map which would then be read into register 118. The output drive 126 (as shown in FIG. 3) would then initiate operation on the appropriate chip as instructed by the sequence control 108 also shown in FIG. 3.

Figure 5:
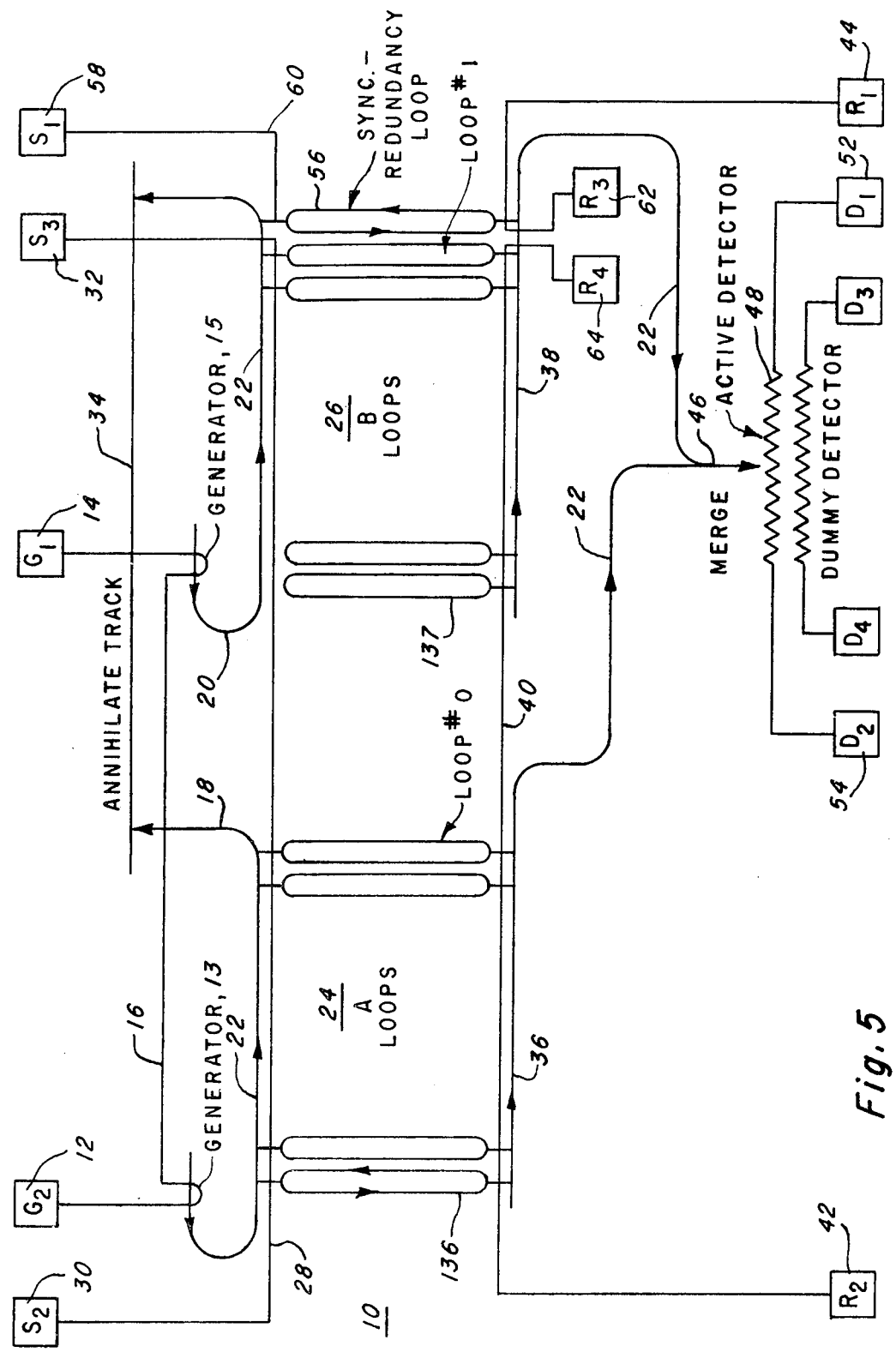
FIG. 5 is a schematic diagram illustrating the block replicate data chip of FIG. 1 modified to include separate read means for the dedicated loop.

A further embodiment of the invention is shown in FIG. 5 where the magnetic domain memory system of FIG. 1 is modified to provide a means to read the data stored in the synchronization-redundancy loop 56 without reading the entire system of minor loops 24 and 26. The synchronization-redundancy loop 56 is read separately by using pins $R_1$, 44, and $R_3$, 62. The remainder of the minor loops 24 and 26 are read by using pins $R_2$, 42, and $R_4$, 64.

Although the present invention has been described in relation to specific embodiments, it should be apparent to those skilled in the art that various modifications may be made without departing from the spirit or scope of the present invention.

What is claimed is:

1. A magnetic domain memory structure comprising:
   a layer of magnetic material capable of supporting magnetic domains;
   said layer of magnetic material being organized into open ended first and second major propagation paths suitably positioned adjacent to and operatively associated with a plurality of minor loops for storing said magnetic domains;
   means for generating magnetic domains connected to said first major propagation paths;

transfer means for moving said magnetic domains from said first major propagation paths to said plurality of minor loops;

replicate means disposed between said plurality of minor loops and said second major propagation paths for transferring magnetic domains from said minor loops to said second major propagation paths;

means for detecting the presence of magnetic domains connected to and operatively associated with said second major propagation paths; and a dedicated minor loop disposed adjacent to said plurality of minor loops, for storing synchronization and redundancy data.

2. A magnetic domain memory structure as set forth in claim 1, wherein said means for detecting magnetic domains comprises an active detector means for sensing magnetic domains and a dummy detector means for canceling noise caused by the rotating magnetic field.

3. A magnetic domain memory structure as set forth in claim 1, further including an annihilate means for destroying magnetic domains connected to said first major propagation paths.

4. A magnetic domain memory structure as set forth in claim 1, wherein said annihilate means comprises a permanent magnet having a polarity opposite to the polarity of said magnetic domains.

5. A magnetic domain memory structure as set forth in claim 1, wherein said synchronization data comprises a predetermined sequence of magnetic domains.

6. A magnetic domain memory structure as set forth in claim 1, wherein said redundancy data comprises a predetermined sequence of magnetic domains for locating defective minor loops.

7. A magnetic domain memory structure as set forth in claim 1, wherein said dedicated minor loop is write accessed by a separate second transfer means.

8. A magnetic domain memory structure as set forth in claim 1, wherein said dedicated minor loop is read accessed by a separate second replicate means.

9. A magnetic domain memory structure as set forth in claim 1, further including a second plurality of minor loops located in spaced parallel relation to said plurality of minor loops.

10. A magnetic domain memory structure as set forth in claim 9, wherein said plurality of minor loops and said second plurality of minor loops are each disposed adjacent to a said first major propagation path having generator means connected thereto.

11. A magnetic domain memory structure as set forth in claim 9, wherein said plurality of minor loops and said second plurality of minor loops are each disposed in a perpendicular fashion adjacent to a said second major propagation path.

12. A magnetic domain memory structure as set forth in claim 10, wherein both of said second major propagation paths merge into one path for transporting magnetic domains to said detector means.

13. A magnetic domain memory system comprising:

a data chip including;

a thin magnetic film suitable for use in generating magnetic domains, said layer of magnetic material being organized into open ended first and second major propagation paths suitably positioned adjacent to and operatively associated with a plurality of minor loops for storing said magnetic domains, transfer means for moving said magnetic domains from said first major propagation paths to said plurality of minor loops, replicate means disposed between said plurality of minor loops and said second major propagation paths for transferring magnetic domains from said minor loops to said second major propagation paths.

means for detecting the presence of magnetic domains connected to and operatively associated with said second major propagation paths, dedicated minor loop disposed in parallel relation to said plurality of minor loops, for storing synchronization and redundancy data; and control means for propagating first and second magnetic domains around each of said major propagation paths and around said minor loops at a selected clock frequency and controlling transfer of magnetic domains between said minor loops and said first and second major propagation paths.

14. A magnetic domain memory system as set forth in claim 13, wherein said control means includes:

synchronization data storage means and redundancy data storage means connected to said data chip, counter means for providing a signal for tracking the location of data stored in said plurality of minor loops, sequence timing means for providing signals to the data chip designating operational modes, and data buffers for storing data retrieved from said data chip for use by a data processor unit.

15. A magnetic domain memory system as set forth in claim 14, further including clock means for providing a signal to said data chip to initialize said redundancy data storage means.

16. A magnetic domain memory system as set forth in claim 14, wherein said synchronization data storage means and said redundancy data storage means comprise shift registers.

17. A magnetic domain memory system as set forth in claim 13 further including a plurality of said data chips.

18. A magnetic domain memory system as set forth in claim 17 further including a volatile memory means connected to said plurality of data chips and said control means.

* * * * *